US012748164B2

(12) United States Patent
Yang et al.

(10) Patent No.: US 12,748,164 B2
(45) Date of Patent: Sep. 29, 2026

(54) SYSTEM AND METHOD FOR CONNECTOR ASSEMBLY VERIFICATION IN BATTERY PACKAGING

(71) Applicant: GM GLOBAL TECHNOLOGY OPERATIONS LLC, Detroit, MI (US)

(72) Inventors: Wuhua Yang, Superior Township, MI (US); Thiagarajan Chidambareswaran, Sterling Heights, MI (US); Alex Jaraki, Grosse Pointe Woods, MI (US); Yanli Zhou, Rochester Hills, MI (US); Miguel Arturo Saez, Clarkston, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 421 days.

(21) Appl. No.: 18/490,472

(22) Filed: Oct. 19, 2023

(65) Prior Publication Data

US 2025/0130292 A1 Apr. 24, 2025

(51) Int. Cl.

| | |
|---|---|
| ***G01R 31/66*** | (2020.01) |
| ***B25J 9/16*** | (2006.01) |
| ***B25J 19/02*** | (2006.01) |
| ***G05B 13/02*** | (2006.01) |

(52) U.S. Cl.

CPC ............ *G01R 31/66* (2020.01); *B25J 9/1694* (2013.01); *B25J 19/026* (2013.01); *G05B 13/0265* (2013.01)

(58) Field of Classification Search

CPC ........ G01R 31/66; G01R 31/50; G01R 31/00; B25J 9/1694; B25J 9/16; B25J 9/00; B25J 19/026; G05B 13/0265; G05B 13/02; G05B 13/00; H01M 10/0404; H01M 10/04; H01M 10/00; H01M 10/6567; G01H 3/00; G01S 5/186; G01S 5/18; G01S 5/00; G01S 5/20; G01S 5/22

See application file for complete search history.

(56) References Cited

U.S. PATENT DOCUMENTS

| | | | | |
|---|---|---|---|---|
| 6,523,417 B1 * | 2/2003 | Donahue | B60N 2/0224 250/221 |
| 8,301,158 B1 * | 10/2012 | Thomas | H04W 12/06 455/414.2 |
| 2012/0089299 A1 * | 4/2012 | Breed | B60R 21/013 701/1 |
| 2015/0251716 A1 * | 9/2015 | Matsuda | B62K 11/04 29/593 |
| 2017/0092099 A1 * | 3/2017 | Walker | G01N 29/14 |
| 2018/0332420 A1 * | 11/2018 | Salume | H04S 3/002 |
| 2018/0356281 A1 * | 12/2018 | Casari | F16B 1/00 |

(Continued)

FOREIGN PATENT DOCUMENTS

| | | |
|---|---|---|
| EP | 3871928 A1 | 9/2021 |
| WO | WO-2020/170212 A1 | 8/2020 |

OTHER PUBLICATIONS

Office Action issued May 24, 2024 in German Application No. 10 2023 135 432.9; 6pgs.

*Primary Examiner* — Mohamed Charioui

(57) ABSTRACT

A method of verifying an assembly of a connector, the method including capturing at least one audio signal from within a footprint of an assembly line during the assembly of the connector; and verifying the assembly of the connector based on the at least one audio signal.

20 Claims, 8 Drawing Sheets

(56) References Cited

U.S. PATENT DOCUMENTS

| | | | | |
|---|---|---|---|---|
| 2020/0004291 | A1* | 1/2020 | Wexler | G10L 15/10 |
| 2023/0251668 | A1* | 8/2023 | Yamana | G06F 3/16<br>701/23 |
| 2023/0403529 | A1* | 12/2023 | Oswald | H04S 3/008 |

* cited by examiner

SYSTEM AND METHOD FOR CONNECTOR ASSEMBLY VERIFICATION IN BATTERY PACKAGING

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to assembly lines and more particularly to a system and/or method to verify proper assembly of a connector within, for example, a battery packaging.

Cooling hoses are essential components in battery electric vehicles (BEVs) as they play a critical role in managing the thermal performance of the vehicle's battery pack and other key components. However, after the battery package is assembled, it may be difficult to access or replace any cooling components in the battery package. Therefore, it is important to perform inline quality verification to ensure a defect free assembly of the battery package.

The cooling hose may be assembled using one or more connectors such as quick connectors (QCs). The quick connectors may be connected manually by an operator and verification of proper engagement of the quick connectors may be performed by a visual inspection by the operator or another person along the assembly line. However, verifying proper seating of the connectors using the naked eye may be difficult since the measurement of each of the connectors may be small (for example, approximately 10 mm).

SUMMARY

At least some example embodiments relate to a method of verifying an assembly of a connector.

In some example embodiments, the method includes capturing at least one audio signal from within a footprint of an assembly line during the assembly of the connector; and verifying the assembly of the connector based on the at least one audio signal.

In some example embodiments, the verifying verifies the assembly in real-time while a battery for an electric vehicle that includes the connector is being assembled on the assembly line.

In some example embodiments, the method further includes tracking a relative position of an operator and an audio sensing device within the footprint, the audio sensing device configured to capture the at least one audio signal.

In some example embodiments, the tracking the relative position includes detecting a position of the operator within the footprint; determining whether the position of the operator is aligned with a position of the audio sensing device; and moving the audio sensing device towards the position of the operator, in response to determining that the position of the operator is misaligned with the position of the audio sensing device.

In some example embodiments, the detecting the position of the operator includes continually detecting the position of the operator.

In some example embodiments, the determining whether the position of the operator is aligned with the position of the audio sensing device includes calculating offsets for linear actuators associated with the audio sensing device based on the relative position of the operator and the audio sensing device.

In some example embodiments, the capturing of the at least one audio signal includes capturing a plurality of audio signals from a plurality of audio sensing devices, respectively, during the assembly of the connector, the plurality audio sensing devices being spaced apart from each other at different locations within the footprint of the assembly line; and fusing the plurality of audio signals to generate a final audio signal, wherein the verifying verifies the assembly of the connector based on the final audio signal.

In some example embodiments, the verifying the assembly of the connector includes determining at least one region of interest in the at least one audio signal; extracting features from the at least one audio signal; and predicting whether the assembly of the connector is a proper assembly or an improper assembly based on the extracted features and training data.

In some example embodiments, the extracting of the features includes converting the at least one audio signal into a visual image, the visual image visually representing the at least one region of interest in the at least one audio signal.

In some example embodiments, the predicting includes determining whether a connection mate signature is found within the extracted features by classifying the extracted features based on the training data using artificial intelligence.

In some example embodiments, the method further includes training a learning model based on features extracted from a training dataset that includes signatures of properly mated connectors and signatures of background noise.

In some example embodiments, the method further includes outputting a verification signal indicating whether the assembly of the connector is the proper assembly or the improper assembly.

In some example embodiments, the method further includes providing feedback to an operator based on the verification signal.

In some example embodiments, the providing the feedback includes controlling an output device such that the output device outputs a first result in response to the verification signal indicating that the assembly of the connector is a proper assembly; and controlling the output device such that the output device outputs a second result different from the first result, in response to the verification signal indicating that the assembly of the connector is an improper assembly.

In some example embodiments, the method further includes controlling a collaborative robot to automatically perform the assembly of the connector based on data captured from a guidance sensor; and controlling the collaborative robot to reassemble the connector, in response to the verifying indicating that the assembly of the connector is an improper assembly.

Other example embodiments relate to a system configured to verify an assembly of a connector.

In some example embodiments, the system includes at least one audio capturing device configured to capture at least one audio signal from within a footprint of an assembly line during the assembly of the connector; and a controller configured to verify the assembly of the connector based on the at least one audio signal.

In some example embodiments, the controller is configured to verify the assembly of the connector in real-time while a battery for an electric vehicle that includes the connector is being assembled on the assembly line.

In some example embodiments, the controller is configured to verify the assembly by determining at least one region of interest in the at least one audio signal, extracting features from the at least one audio signal, and predicting whether the assembly of the connector is a proper assembly or an improper assembly based on the extracted features and training data.

In some example embodiments, the controller is configured to extract features by converting the at least one audio signal into a visual image, the visual image visually representing the at least one region of interest in the at least one audio signal.

In some example embodiments, the controller is configured to predict whether the assembly of the connector is the proper assembly or the improper assembly by determining whether a connection mate signature is found within the extracted features by classifying the extracted features based on the training data using artificial intelligence.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Example embodiments disclose a system and method for electronic verification of the engagement of the connector assembly. The verification may be performed in real-time such that instant feedback can be provided to an operator to correct any defects in the engagement of the connectors prior to completion of the assembly of the battery package.

Figure 1:
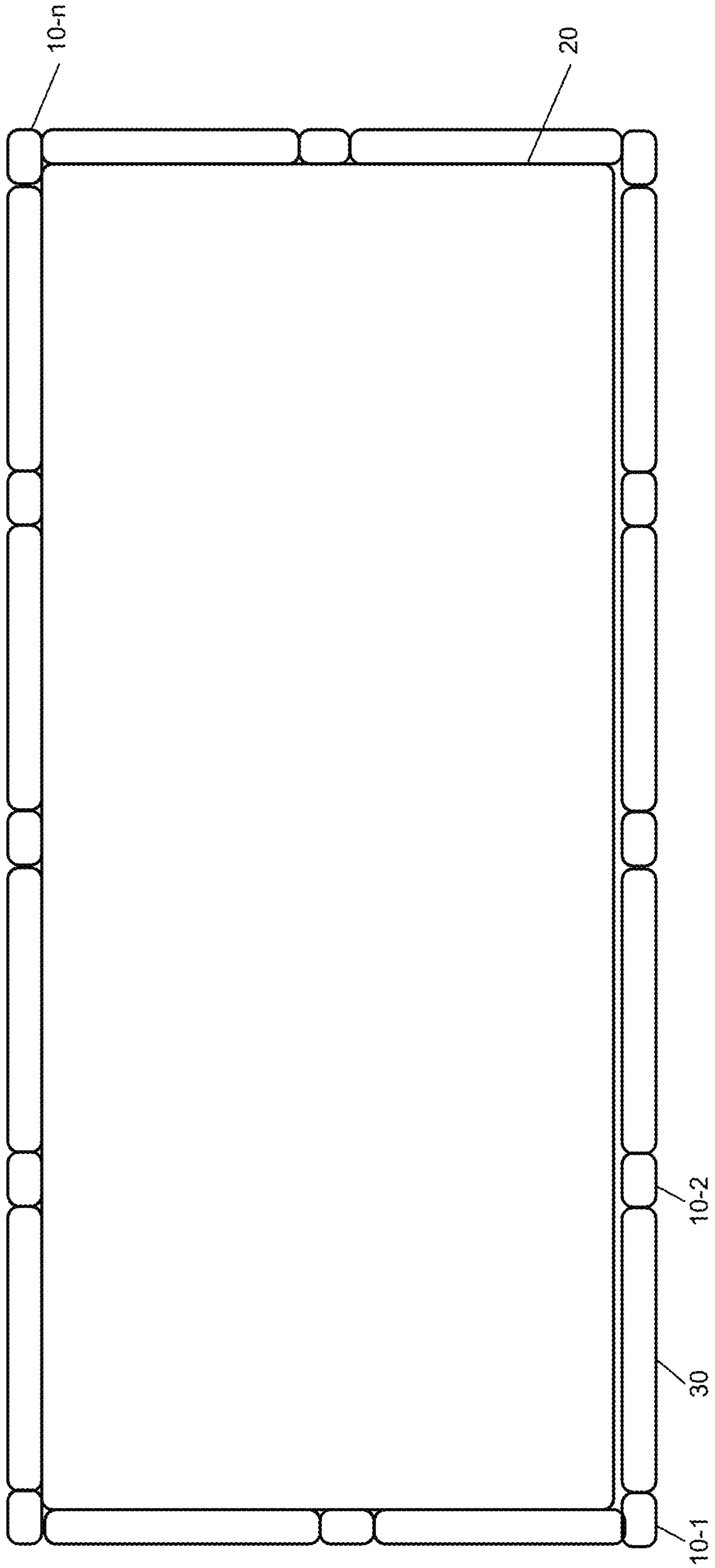
FIG. 1 illustrates a battery assembly of a battery electric vehicle (BEV) according to some example embodiments.
Figure 2:
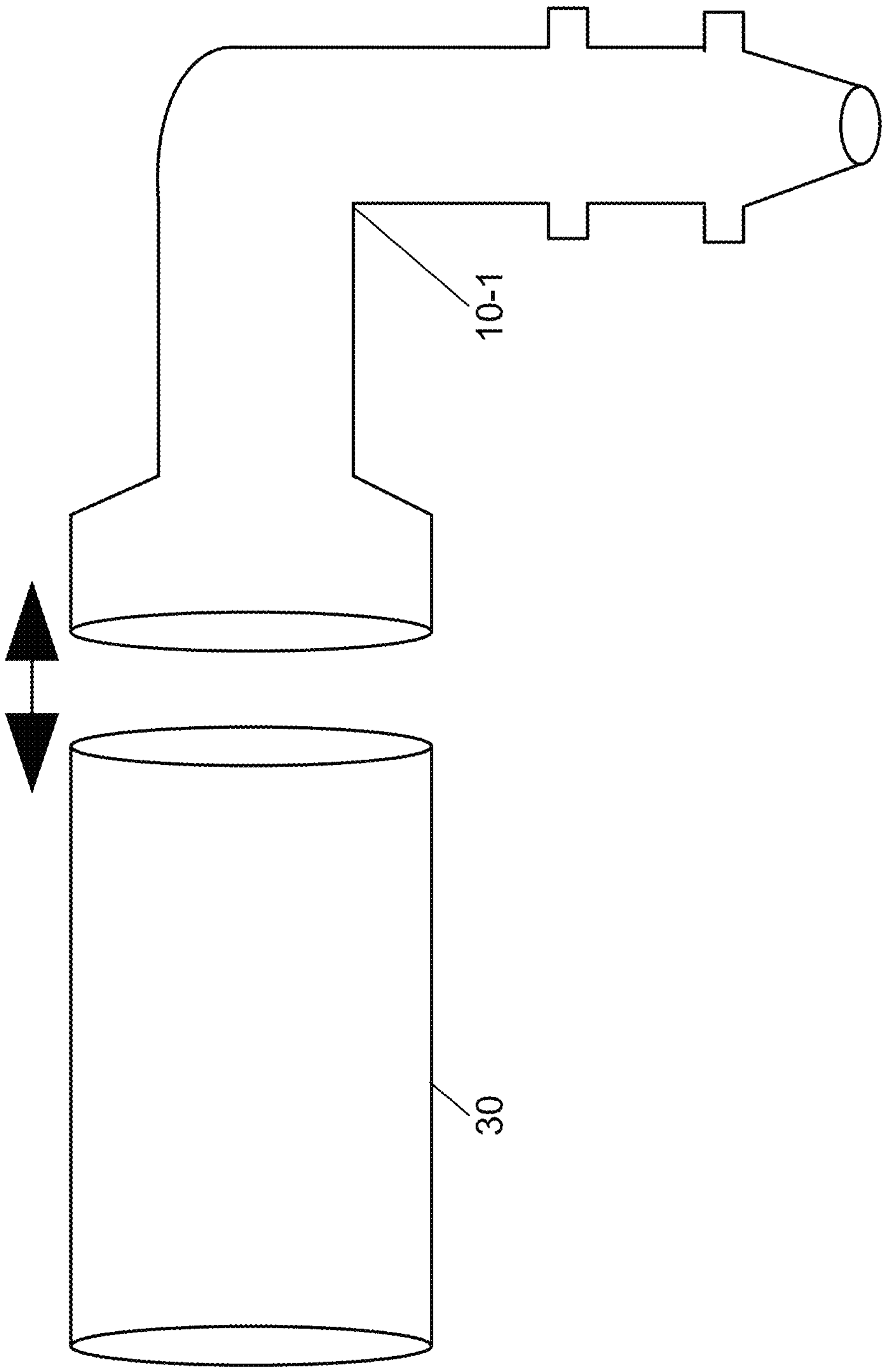
FIG. 2 illustrates a close-up view of an engaged quick connector in a battery of a battery electric vehicle (BEV) according to some example embodiments.

FIG. 1 illustrates a battery assembly of a battery electric vehicle (BEV) according to some example embodiments, and FIG. 2 illustrates a close-up view of an engaged quick connector in a battery of a battery electric vehicle (BEV) according to some example embodiments.

Referring to FIGS. 1 and 2, current and future electric vehicle subsystems may increasingly rely on thermal regulation (e.g., heating and/or cooling) in order to achieve the required performance level. As such, properly designed and assembled thermal management systems may be critical.

A vehicle may include one or more hoses 30 (or, alternatively, fluid lines) that circulate a liquid for heating and/or cooling, where each of the hoses are formed from a plurality of interconnected segments. For example, the liquid may be a 50/50 mix of water and antifreeze, such as, for example ethylene glycol. However, example embodiments are not limited thereto. The segments of each hose 30 may be formed by interconnecting the segments thereof via connectors 10-1 to **10-*n*. The connectors 10-1 to 10-*n* may be quick connectors (QCs). QCs are a popular solution to assemble these hoses 30 during vehicle integration and may help to enable both efficient and safe connections. The result is that the more hoses 30 that a vehicle has, the more connectors 10-1 to 10-*n*** may be needed to keep the vehicle operating safe and effective.

The connectors 10-1 to **10-*n* are typically manually installed during vehicle assembly by applying manual pressure from operators. However, as subsystems, such as a battery 20 increase in size to increase the energy storage capacity and range of the vehicle, it may become more difficult to ensure that the connectors 10-1 to 10-*n* are properly mated due to the increased number of connectors 10-1 to 10-*n* and the reduced space available for an operator to manually manipulate such connectors 10-1 to 10-*n*. Further, in Hybrid cars electric drive components must coexist with an internal combustion engine and its related components-including fuel lines, filters, and fuel tank, which may further reduce increase the complexity and density of components, and the proper connection of the various connectors 10-1 to 10-*n* in these complex environments can be particularly challenging to make and verify. However, reliable connections are critical since any leakage caused by misassemble may generate significant safety threats. For example, it may be difficult to repair incorrectly mated connectors 10-1 to 10-*n* after assembly of the battery 20, and incorrectly mated connectors 10-1 to 10-*n* may lead to leakage of the fluid from within the hose 30, which may cause an electrical fire within the battery 20**.

While FIG. 1 illustrates a certain number of hoses 30 connected by a number of connectors 10-1 to **10-*n*, the number of hoses 30 and connectors 10-1 to 10-*n* shown is for illustrative purposes and is not to be considered limiting. Likewise, the layout of the hoses 30 and connectors 10-1 to 10-*n* relative to the battery 30 and the illustrated design of the connectors 10-1 to 10-*n*** is for illustrative purposes and is not meant to be considered limiting.

Figure 3:
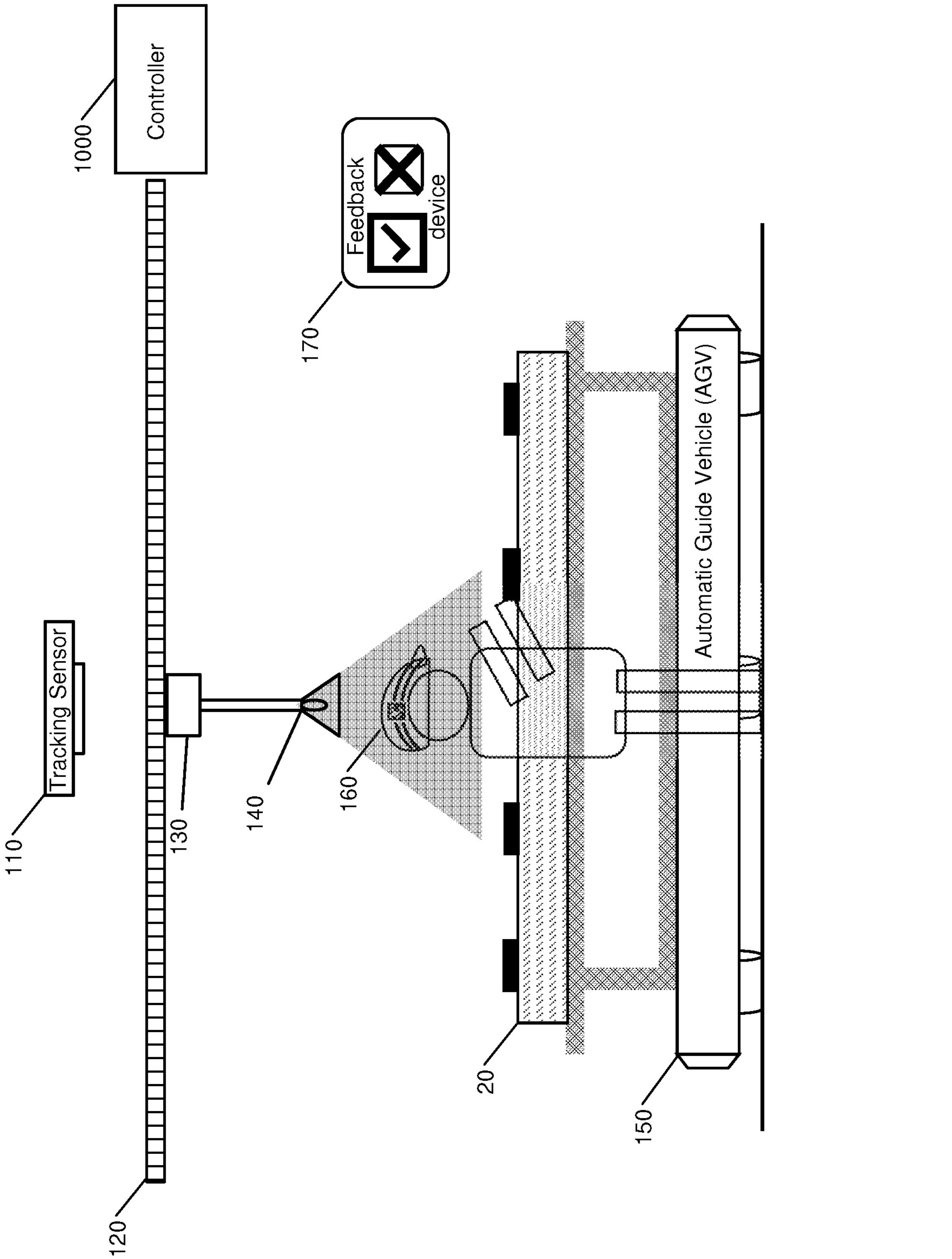
FIG. 3 illustrates a system for verifying a connector assembly according to a first example embodiment.

FIG. 3 illustrates a system for verifying a connector assembly according to a first example embodiment.

Referring to FIG. 3, a system for verifying a connector assembly may include a position tracking sensor 110, a rail 120, at least one actuator 130, an audio sensing device 140, an automatic guide vehicle (AGV) 150, a tracking marker 160, a feedback device 170, and a controller 1000.

The position tracking sensor 110 may be configured to sense a position of an operator and output position data indicating the position of the operator. For example, the position tracking sensor 110 may be mounted above a footprint in the assembly station, where the automatic guide vehicle 150 is configured to rest, and may be configured to sense the position of the operator based on data collected from within the footprint. In some example embodiments, the position tracking sensor 110 be a light detection and ranging (LiDAR) sensor configured to detect the operator using a laser. For example, LiDAR can be used to identify the operator as a moving obstacle within the assembly station based on laser scan data obtained by the position tracking sensor 110. In other example embodiments, the position tracking sensor 110 may be a camera configured to capture an image of the footprint and detect a position of the operator from within the captured image. For example, the position tracking sensor 110 may generate image data that can be used to detect the operator using a computer vision algorithm, such as a Deep Sort (Simple Online and Realtime Tracking) model.

The rail 120 may be made of metal and may extend longitudinally along the length of the assembly station and may include a track that allows the at least one actuator 130 to move linearly thereon. The at least one actuator 130 may include a pair of 2D linear actuators that move longitudinally along the rail 120 in an X-axis direction and also extends or contracts to move up and down along a Z-axis direction. The 2D linear actuators may convert rotary motion into linear motion. For example, the 2D linear actuators may have a rack and pinion design.

The audio sensing device 140 may be attached to an end of the at least one actuator 130. The audio sensing device 140 may include an audio sensor and a long-range amplifier.

The audio sensor may be a microphone that is a transducer that converts sound waves into an electrical signal. The microphone may be a directional microphone, in which the microphone sensitivity is one directional, or may be an omni-directional microphone, in which the microphone sensitivity may be 360 degrees. The long-range amplifier may include a parabolic reflector that collects and focuses sound waves onto the transducer to assist in picking up sound waves from a distance, and, thus, allow the audio sensing device 140 to be positioned away from the operator.

The automatic guide vehicle (AGV) 150 may be equipped with navigation and control systems that allow the AGV 150 to move and perform tasks without human intervention. The AGV 150 may be used as a conveyor to carry the battery 20 and other components of the vehicle along an assembly line.

The tracking marker 160 may be a tracker placed on, for example a safety helmet worn by the operator. However, example embodiments are not limited thereto and the tracking marker 160 may be placed in any position on the operator that is detectable by the position tracking sensor 110. In some example embodiments, the tracking marker 160 may be an April tag or QR code. In other example embodiments, the tracking marker 160 may be omitted and the position tracking sensor 110 may sense the position of the operator using, for example, a machine learning algorithm. For example, the position tracking sensor 110 may utilize a Deep Sort (Simple Online and Realtime Tracking) model to track the operator's movement around the footprint of the AVG 150.

The feedback device 170 may be a display device that outputs a visual display to the operator or other individuals associated with the assembly line. For example, the feedback device 170 may output a green light or a red light based on a verification signal input thereto. In other example embodiments, the feedback device 170 may output other forms of feedback to the operator or other individuals associated with the assembly line. For example, the feedback device 170 may output different sounds based on the verification signal or may output different vibration patterns to the operator or other individuals associated with the assembly line based on the verification signal input thereto.

The controller 1000 may control at least a portion of the system for verifying the connector assembly. For example, the controller 1000 may collect the position data from the position tracking sensor 110 and control the at least one actuator 130 based on position data. Further, as discussed in more detail below, the controller 1000 may collect audio data from the audio sensing device 140 and perform a verification operation based on the collected audio data. The controller 1000 may control the feedback device 170 based on a result of the verification operation. In some example embodiments, the controller 1000 may not control the AGV 150 such that the AGV 150 may be controlled by a separate controller. In other example embodiments, the controller 1000 may also control the AGV 150 to move the AGV 150 along the assembly line.

Figure 4:
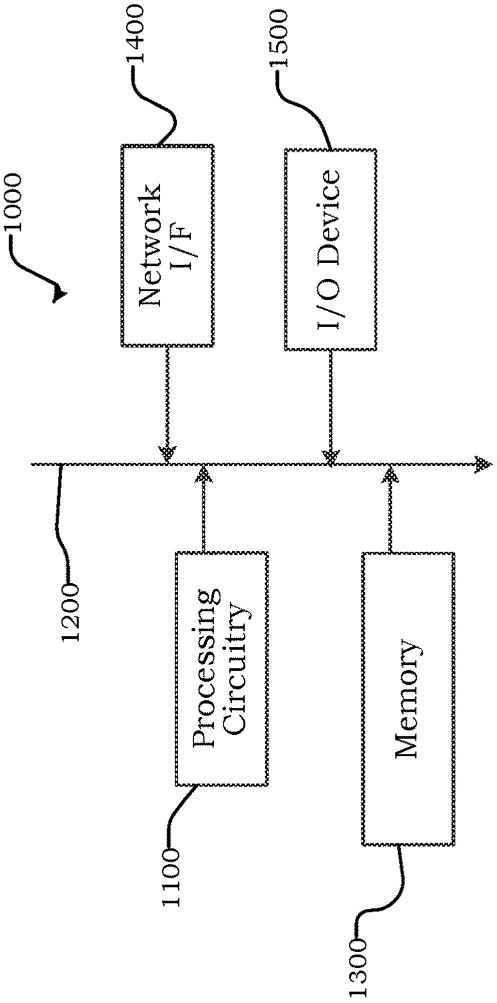
FIG. 4 illustrates a hardware configuration of a controller of the system for verifying the connector assembly according to some example embodiments.

FIG. 4 illustrates a hardware configuration of a controller of the system for verifying the connector assembly according to example embodiments.

Referring to FIG. 4, the controller 1000 may include processing circuitry 1100, such as at least one processor, at least one communication bus 1200, a memory 1300, at least one network interface (I/F) 1400. Further, the controller 1000 may also include at least one input/output (I/O) device 1500 (e.g., a keyboard, a monitor, a touchscreen, a mouse, a microphone, a camera, a speaker, etc.), etc., but the example embodiments are not limited thereto.

In at least one example embodiment, the processing circuitry 1100 may include processor cores, distributed processors, or networked processors. The processing circuitry 1100 may be configured to control one or more elements of the controller 1000, and thereby cause the controller 1000 to perform various operations. The processing circuitry 1100 is configured to execute processes by retrieving program code (e.g., computer readable instructions) and data from the memory 1300 to process them, thereby executing special purpose control and functions of the controller 1000. Once the special purpose program instructions are loaded into, (e.g., the at least one processor), the processing circuitry 1100 executes the special purpose program instructions, thereby transforming the processing circuitry 1100 into a special purpose processor.

In at least one example embodiment, the at least one communication bus 1200 may enable communication and/or data transmission to be performed between elements of the controller 1000. The communication bus 1200 may be implemented using a high-speed serial bus, a parallel bus, and/or any other appropriate communication technology. According to some example embodiments, the controller 1000 may include a plurality of communication buses (not shown).

In at least one example embodiment, the memory 1300 may be a non-transitory computer-readable storage medium and may include a random-access memory (RAM), a read only memory (ROM), and/or a permanent mass storage device such as a disk drive, or a solid-state drive. Stored in the memory 1300 is program code (i.e., computer readable instructions) related to verifying a connector assembly as described herein, and controlling the at least one network interface 140, and/or at least one I/O device 1500, etc.

Such software elements may be loaded from a non-transitory computer-readable storage medium independent of the memory 1300, using a drive mechanism (not shown)

connected to the controller 1000, or via the at least one network interface 1400, and/or at least one I/O device 1500, etc.

Figure 5:
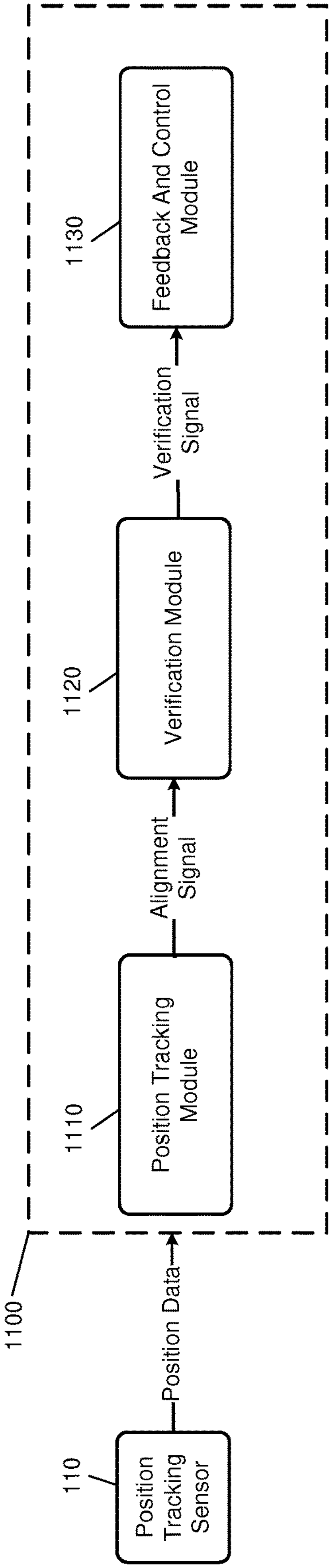
FIG. 5 illustrates a software configuration of the controller of the system for verifying the connector assembly according to some example embodiments.

FIG. 5 illustrates a software configuration of the controller of the system for verifying the connector assembly according to example embodiments.

Referring to FIG. 5, the processing circuitry 1100 of the controller 1000 may execute program code (e.g., computer readable instructions) retrieved from, for example, the memory 1300 that transform the processing circuitry 1100 into a special purpose processor that includes a position tracking module 1110, a verification module 1120 and a feedback and control module 1130 that together perform a method of verifying a connector assembly. Operation of each of the modules 1110 to 1130 will be discussed below with reference to FIG. 6.

While the above functions are described using the above-mentioned modules 1110 to 1130 to increase the clarity of the description, the processing circuitry 1100 is not intended to be limited to these functional units. For example, in one or more example embodiments, the various operations and/or functions of the functional units may be performed by other ones of the functional units. Further, the processing circuitry 1100 may perform the operations and/or functions of the various functional units without sub-dividing the operations and/or functions of the computer processing units into these various functional units FIG. 6 illustrates a method of verifying a connector assembly according to some example embodiments.

Figure 6:
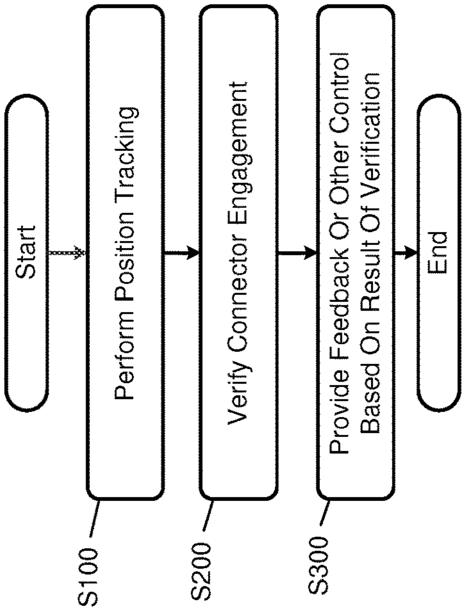
FIG. 6 illustrates a method of verifying a connector assembly according to some example embodiments.

Referring to FIGS. 4-6, in operation S100, the controller 1000 may perform position tracking. For example, the position tracking module 1110 may receive position data from the position tracking sensor 110 and track the position of the operator based on the received position data.

Figure 7:
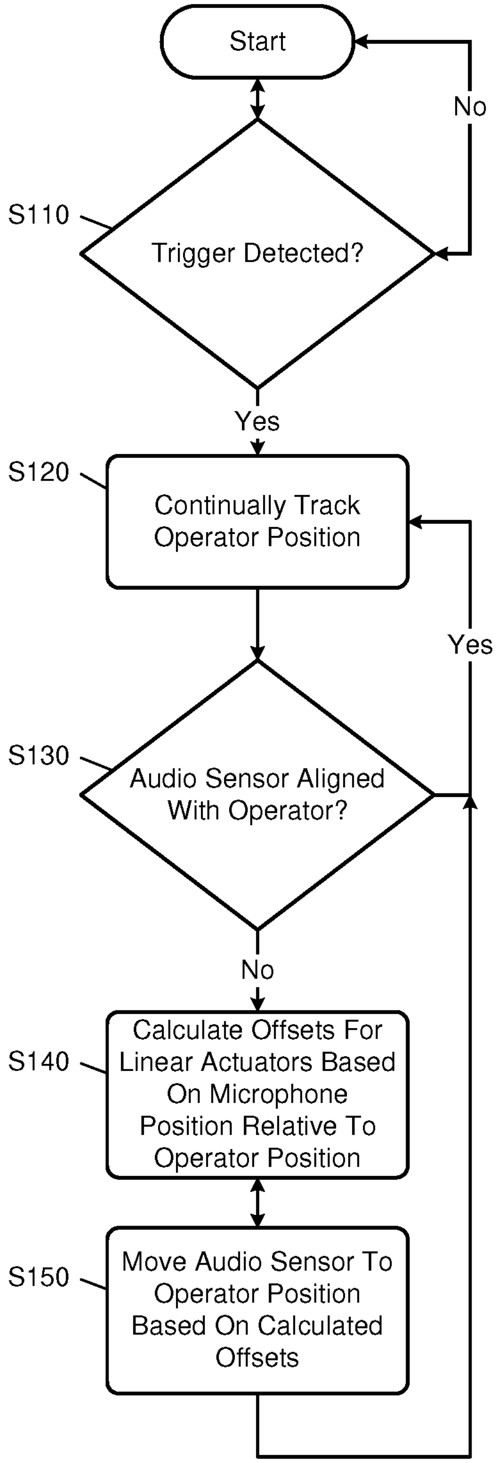
FIG. 7 illustrates a method of tracking a position of an operator according to some example embodiments.

FIG. 7 illustrates a method of tracking a position of an operator according to example embodiments.

Referring to FIGS. 4-7, in operation S110, the position tracking module 1110 may determine whether a trigger is detected. For example, in some example embodiments, the trigger may occur when the AGV 150 has stopped at a preset (or, alternatively, a desired) position defining the footprint in the assembly station, or may occur when the presence of operator is detected within the footprint of the AGV 150. However, example embodiments are not limited thereto. If the position tracking module 1110 determines that the trigger has not occurred, the position tracking module 1110 may wait until receipt of the trigger.

In operation S120, upon detecting the trigger, the position tracking module 1110 may continually track the position of the operator. For example, the position tracking sensor 110 may continually generate the position data indicating the position of the operator based on data continually collected from within the footprint of the AGV 150 and provide the generated position data to the controller 1000 (e.g., the position tracking module 1110).

In operation S130, the position tracking module 1110 may determine whether the audio sensing device 140 is aligned with the operator. For example, the position tracking module 1110 may determine a relative difference between the position of the audio sensing device 140 and the position of the operator, and determine whether the audio sensing device 140 is aligned with the operator based on the difference therebetween. If the position tracking module 1110 determines that the audio sensing device 140 is sufficiently aligned with the operator, the position tracking module 1110 may not further move the audio sensor. Instead, the position tracking module 1110 may proceed back to operation S120 and continually monitor the position of the operator to determine whether the operator has shifted positions within the footprint of the AGV 150. If the position tracking module 1110 determines that the operator has shifted positions by more than a threshold, the position tracking module 1110 may determine that that the audio sensing device 140 has become unaligned with the operator and proceed to operation S140.

A range of positions may be considered sufficiently aligned based on empirical measurements of audio data in which an audio signal captured within the range of positions accurately identified a signature of a properly mated connector 10-1 to **10-*n* using the same or similar type of audio sensing device 140**.

In operation S140, if the position tracking module 1110 determines that the audio sensing device 140 is not sufficiently aligned with the operator, the position tracking module 1110 may calculate the offsets (e.g., the X-axis offset and the Z-axis offset) between the position of the audio sensing device 140 and the position of the operator.

In operation S150, the position tracking module 1110 may instruct the at least one actuator 130 to move to the audio sensing device 140 to align the audio sensing device 140 with the operator. For example, the position tracking module 1110 may instruct the at least one actuator 130 to move in one or more of the X-direction (e.g., horizontally along a length of the footprint of the AGV 150) or the Z-direction (e.g. vertically above the footprint of the AGV 150). Once the audio sensing device 140 is sufficiently aligned with the operator, the position tracking module 1110 may generate an alignment signal and may proceed back to operation S120 and continue to track the position of the operator to determine whether the operator has shifted positions by more than a threshold within the footprint of the AGV 150.

Referring back to FIG. 6, in operation S200, the controller 1000 may perform a verification operation. For example, the verification module 1120 may receive the alignment signal from the position tracking module 1110 indicating that the audio sensing device 140 is sufficiently aligned with the operator, and may then perform the verification operation.

Figure 8:
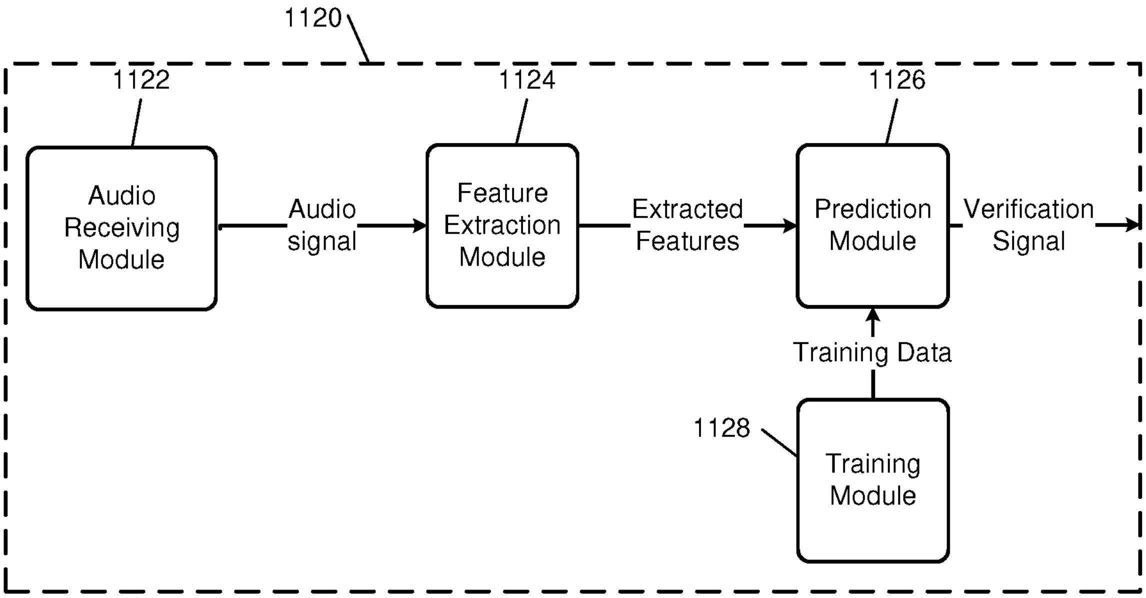
FIG. 8 illustrates a verification module according to some example embodiments.
Figure 9:
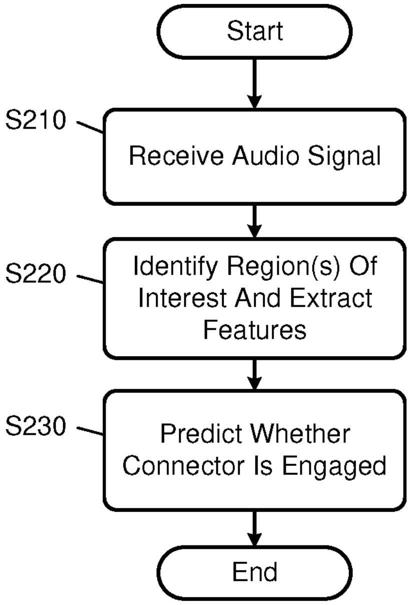
FIG. 9 illustrates a method of performing a verification operation according to some example embodiments.

FIG. 8 illustrates a verification module according to example embodiments and FIG. 9 illustrates a method of performing a verification operation according to example embodiments.

Referring to FIGS. 8 and 9, in operation S210, an audio receiving module 1122 included in the verification module 1120 may buffer and/or process the audio signal received from the audio sensing device 140.

In operation S220, a feature extraction module 1124 included in the verification module 1120 may receive the processed audio signal, may identify the region(s) of interest within the received audio signal, and may perform feature extraction of the identified region(s) of interest within the audio signal and output the extracted features.

The region(s) of interest may include one or more ranges of frequencies and/or amplitudes that have been previously identified through empirical studies as containing the signature of the sound the connectors 10-1 to **10-*n* produce when properly mated, and thus the region(s) of interest may be identified by analyzing the energy distribution of the audio signal captured at the time the operator mates the connectors 10-1 to 10-*n***.

The verification module 1120 may perform feature extraction by inputting the identified region(s) of interest within the captured audio signal into a series of signal processing layers that extract features that can be used to predict whether the features contain a connection mate signature.

The verification module 1120 may generate a visual image of the extracted features from the region of interest within the captured audio signal where the image may contain the connection mate signature.

In operation S230, a prediction module 1126 included in the verification module 1120 may predict whether the connector, for example, one of the connectors 10-1 to 10-*n* is properly assembled based on whether the connection mate signature is found within the extracted features based on the training data, and may output a verification signal based thereon. For example, the prediction module 1126 may analyze the visual image of the extracted features to determine if the image contains a known visual representation of the connection mate signature.

For example, the prediction module 1126 may utilize artificial intelligence to perform classification using convolution neural network (CNN) that is pre-trained based deep learning model. The prediction module 1126 may utilize the trailed model to perform classification based on a classification score.

The training data may be assembled by a training module 1128. For example, the training module 1128 may receive a recorded data set, train a model based on the recorded data set, deploy the trained model, test the trained model, and monitor and record the results. The model may be trained on the features extracted from a dataset that consists of features of multiple classes including signatures of properly mated connectors 10-1 to 10-*n* and signatures of non-connector classes (background noise, voice, or any other abnormal sound). The recorded results may include true positives (TPs) when the model accurately predicts a properly assembled connector 10-1 to 10-*n*, false positives (FPs) when the model inaccurately predicts a properly assembled connector 10-1 to 10-*n* in response to other sounds, true negatives (TN) when the model accurately predicts a non-properly assembled connector 10-1 to 10-*n*, and false negatives (FN) when the model inaccurately predicts a non-properly assembled connector 10-1 to 10-*n*. The training module 1128 may retrain the model based on the recorded results by, for example, adding TP and FN to the connector dataset and adding FP and TN to the non-connector dataset.

Referring back to FIG. 6, in operation S300, the controller 1000 may perform a provide feedback or perform other control based on the verification signal. For example, the feedback and control module 1130 may receive the verification signal from the position tracking module 1110 and may control the feedback device 170 based on the verification signal. For example, when the verification signal indicates that one of the one of the connectors 10-1 to 10-*n*, which is being assembled by the operator is a properly assembled connector, the feedback and control module 1130 may control the feedback device 170 to provide positive feedback to the operator. In contrast, when the verification signal indicates that one of the one of the connectors 10-1 to 10-*n*, which is being assembled by the operator is a non-properly assembled connector, the feedback and control module 1130 may control the feedback device 170 to provide negative feedback to the operator. In some example embodiments, the feedback device 170 may output a first color (e.g., a green) light as the positive feedback and may output a second color (e.g., a red) light as the negative feedback. However, example embodiments are not limited thereto. In other example embodiments, the feedback device 170 may output a first sound as the positive feedback and may output a second sound as a negative feedback. In other example embodiments, the feedback device 170 may provide haptic feedback such as providing a vibration sensation to the operator. For example, the feedback device 170 may provide a first vibration pattern to the operator as the positive feedback and may provide a second vibration pattern to the operator as the negative feedback. In other example embodiments, the feedback device 170 may only output a single vibration pattern such as when the verification signal indicates the properly assembled connector and may not output feedback when the connector is non-properly assembled connector. However, example embodiments are not limited thereto.

The controller 1000 may perform the position tracking operation S100 and the verification operator S200 in real-time and may provide real-time feedback to the operator in operation S300 based on the results of the verification operation. Therefore, the controller 1000 may allow the operator to immediately correct misassembled connectors 10-1 to 10-*n* prior to final assembly of the battery 20. Therefore, the controller 1000 may ensure the proper connection of the various connectors 10-1 to 10-*n* prior to final assembly of the battery 20 and, thus, may the significant safety threats caused by improper mating of the connectors and the significant costs associated with preparing the same after final assembly of the battery 20.

Figure 10:
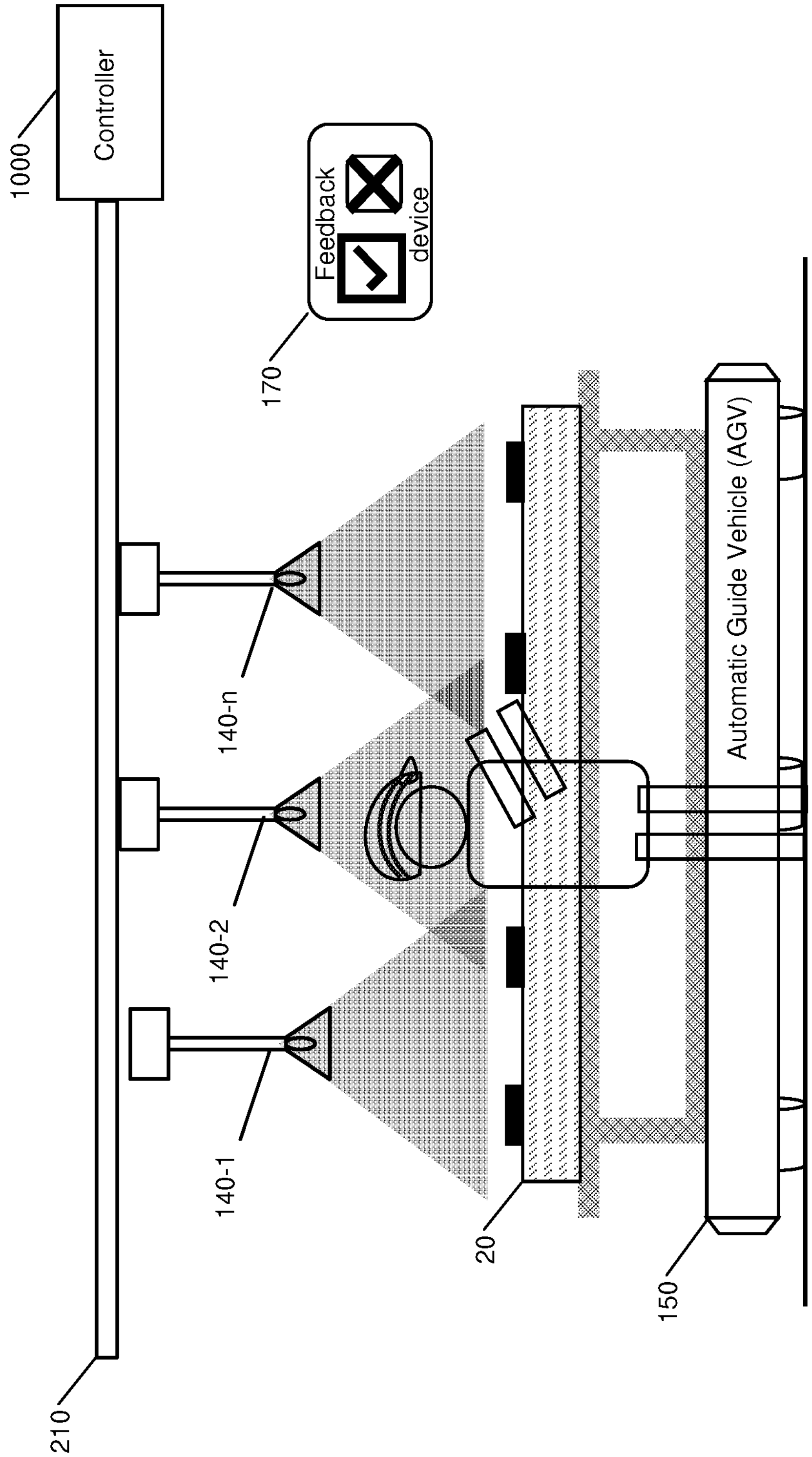
FIG. 10 illustrates a system for verifying a connector assembly according to a second example embodiment.

FIG. 10 illustrates a system for verifying a connector assembly according to a second example embodiment.

Referring to FIG. 10, a system for verifying a connector assembly according to another example embodiment may include a fixed beam 210 rather than a rail and may include a plurality of audio sensing devices 140-1 to 140-*n* attached to the fixed beam 210. Each of the plurality of audio sensing devices 140-1 to 140-*n* may be substantially similar to the audio sensing device 140.

Rather than tracking the position of the operator and moving the audio sensor to align the audio sensor with the operator, audio signals may be collected from the plurality of audio sensing devices 140-1 to 140-*n* arranged along the fixed beam 210 within the footprint of the AGV 150. The verification module 1120, for example, the audio receiving module 1122, may fuse the audio data from the plurality of audio sensing devices 140-1 to 140-*n* by synchronizing the audio signals from the plurality of audio sensing devices 140-1 to 140-*n* and processing the synchronized signals as a single fused audio signal to detect a connection mate signature. When the connection mate signature is detected, the audio receiving module 1122 may calculate at time delay sound arriving at each of the plurality of audio sensing devices 140-1 to 140-*n* and may use a triangulation method to identify the sound source's location. For example, audio receiving module 1122 may utilize a time of flight and signal triangulation method to determine the location and/or source of the received sound, thereby identifying which of the connectors 10-1 to 10-*n* is being assembled, and, thus, which of the connectors 10-1 to 10-*n* may be incorrectly mated.

Other than having a plurality of stationary audio sensing devices 140-1 to 140-*n* attached to the fixed beam 210 and omitting the position tracking sensor 110, the system for verifying a connector assembly according to the second example embodiment may be substantially the same as the system for verifying a connector assembly according to the first example embodiment. Accordingly, repeated description of the shared functions will be omitted for the sake of brevity.

Figure 11:
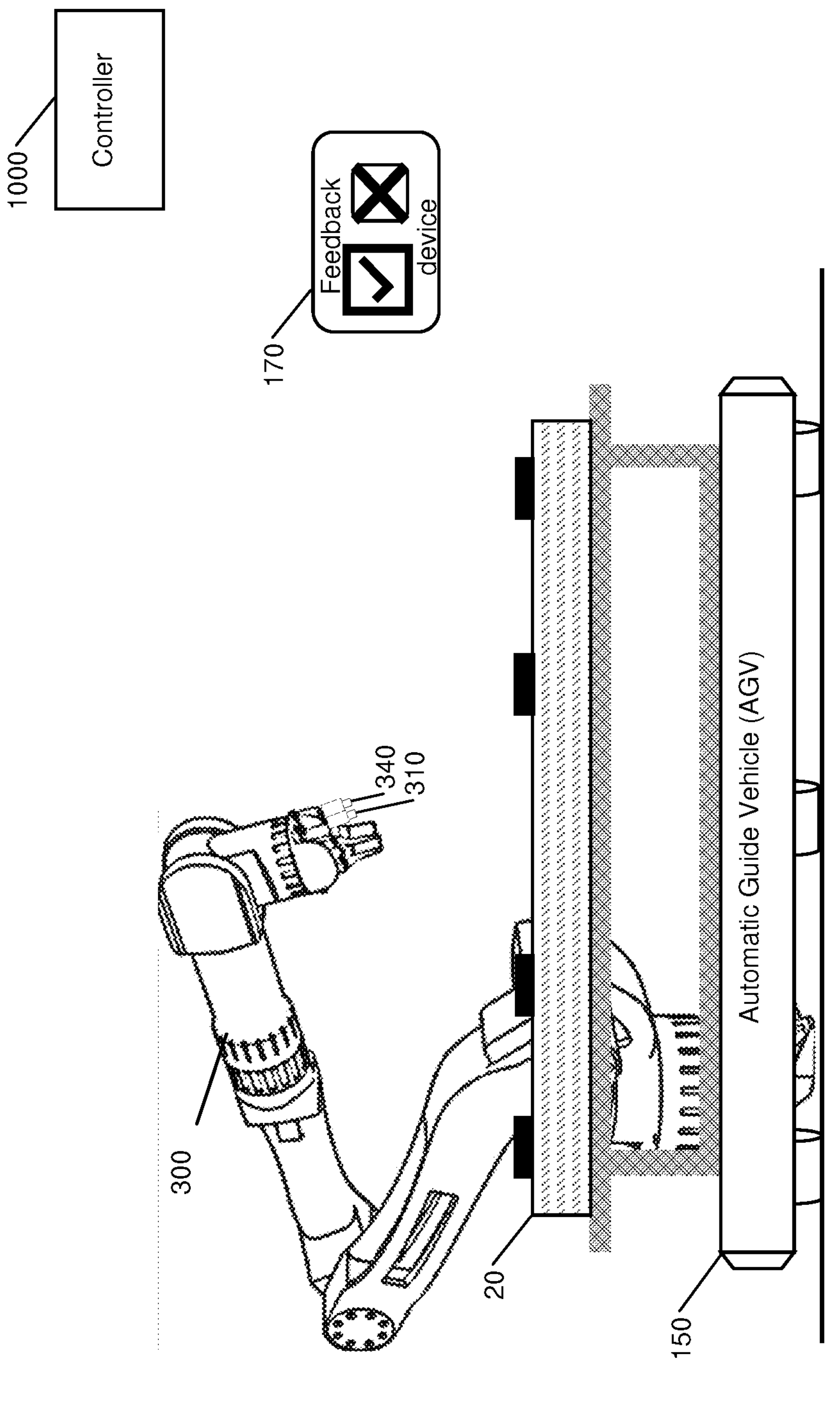
FIG. 11 illustrates a system for verifying a connector assembly according to a third example embodiment.

FIG. 11 illustrates a system for verifying a connector assembly according to a third example embodiment.

Referring to FIG. 11, a system for verifying a connector assembly according to a third example embodiment may include a collaborative robot 300. The collaborative robot

300 may include guidance sensor 310 and an audio sensing device 340 attached to the end effector of the collaborative robot 300. The guidance sensor 310 may be a 2D camera configured to perform vision guidance of the collaborative robot 300. The audio sensing device 340 may be substantially the same as the audio sensing device 140, however, the audio sensing device 340 may not include a long-range amplifier since there may not be a need to position the audio sensing device 140 a distance away from the collaborative robot 300.

The collaborative robot 300 may be controlled by the controller 1000 based on data provided by, for example, the feedback and control module 1130, or may be controlled by a separate controller. The collaborative robot 300 may automatically assemble the connectors 10-1 to **10-*n* based on data captured from the guidance sensor 310**.

Other than having the collaborative robot 300 rather than a position tracking sensor 110, a rail 120, at least one actuator 130, and an audio sensing device 140, the system for verifying a connector assembly according to the third example embodiment may be substantially the same as the system for verifying a connector assembly according to the first example embodiment.

For example, the controller 1000 may predict whether the collaborative robot 300 has a properly assembled the connectors 10-1 to **10-*n*** in substantially the same manner as discussed supra. Accordingly, repeated description of the shared functions will be omitted for the sake of brevity.

In some example embodiments, when the controller 1000 (i.e., the verification module 1120) predicts that the collaborative robot 300 has improperly assembled one or more of the connectors, the feedback and control module 1130 may control the collaborative robot 300 to automatically reconnect any improperly assembled connectors 10-1 to **10-*n***.

Further, in some example embodiments, the controller 1000 (i.e., the feedback and control module 1130) may control the display device 170 in substantially the same manner as the system for verifying a connector assembly according to the first example embodiment. For example, the feedback and control module 1130 may provide visual, audio and/or haptic feedback to an operator of the collaborative robot 300 or another person along the assembly line. However, example embodiments are not limited thereto and in the example embodiments, the display device 170 may be omitted and the feedback and control module 1130 may only control the collaborative robot 300 to reconnect any improperly assembled connectors.

As discussed above, example embodiments may assist in ensuring the proper connection of the various connectors 10-1 to **10-*n* prior to final assembly of the battery 20 and, thus, may avoid leakage and the significant safety threats caused by improper mating of the connectors. Further, example embodiments may provide real-time feedback to the operator or other individuals along the assembly line prior to assembly of the battery 20**.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A method of verifying an assembly of a connector, the method comprising:

capturing a plurality of audio signals by a plurality of audio sensing devices, respectively, from within a footprint of an assembly line during the assembly of the connector, the plurality audio sensing devices being spaced apart from each other at different locations within the footprint of the assembly line;

fusing the plurality of audio signals to generate a final audio signal; and verifying the assembly of the connector based on the final audio signal.

2. The method of claim 1, wherein the verifying the assembly of the connector comprises:

determining at least one region of interest in the at least one audio signal;

extracting features from the at least one audio signal; and predicting whether the assembly of the connector is a proper assembly or an improper assembly based on the extracted features and training data.

3. The method of claim 2, wherein the extracting of the features comprises:

converting the at least one audio signal into a visual image, the visual image visually representing the at least one region of interest in the at least one audio signal.

4. The method of claim 2, wherein the predicting comprises:

determining whether a connection mate signature is found within the extracted features by classifying the extracted features based on the training data using artificial intelligence.

5. The method of claim 4, further comprising:

training a learning model based on features extracted from a training dataset that includes signatures of properly mated connectors and signatures of background noise.

6. The method of claim 2, further comprising:

outputting a verification signal indicating whether the assembly of the connector is the proper assembly or the improper assembly.

7. The method of claim 6, further comprising:

providing feedback to an operator based on the verification signal.

8. The method of claim 7, wherein the providing the feedback comprises:

controlling an output device such that the output device outputs a first result in response to the verification signal indicating that the assembly of the connector is a proper assembly; and controlling the output device such that the output device outputs a second result different from the first result, in response to the verification signal indicating that the assembly of the connector is an improper assembly.

9. The method of claim 1, further comprising:

tracking a relative position of an operator and an audio sensing device within the footprint, the audio sensing device configured to capture the at least one audio signal.

10. The method of claim 9, wherein the tracking the relative position comprises:

detecting a position of the operator within the footprint;

determining whether the position of the operator is aligned with a position of the audio sensing device; and moving the audio sensing device towards the position of the operator, in response to determining that the position of the operator is misaligned with the position of the audio sensing device.

11. The method of claim 10, wherein the detecting the position of the operator comprises:

continually detecting the position of the operator.

12. The method of claim 10, wherein the determining whether the position of the operator is aligned with the position of the audio sensing device comprises:

calculating offsets for linear actuators associated with the audio sensing device based on the relative position of the operator and the audio sensing device.

13. The method of claim 1, wherein the verifying verifies the assembly in real-time while a battery for an electric vehicle that includes the connector is being assembled on the assembly line.

14. The method of claim 1, further comprising:

controlling a collaborative robot to automatically perform the assembly of the connector based on data captured from a guidance sensor; and controlling the collaborative robot to reassemble the connector, in response to the verifying indicating that the assembly of the connector is an improper assembly.

15. A system configured to verify an assembly of a connector, the system comprising:

a plurality of audio capturing devices spaced apart from each other at different locations within a footprint of the assembly line and configured to capture a plurality of audio signals from within the footprint of an assembly line during the assembly of the connector; and a controller configured to fuse the plurality of audio signals to generate a final audio signal and verify the assembly of the connector based on the final audio signal.

16. The system of claim 15, wherein the controller is configured to verify the assembly by:

determining at least one region of interest in the at least one audio signal, extracting features from the at least one audio signal, and predicting whether the assembly of the connector is a proper assembly or an improper assembly based on the extracted features and training data.

17. The system of claim 16, wherein the controller is configured to extract features by:

converting the at least one audio signal into a visual image, the visual image visually representing the at least one region of interest in the at least one audio signal.

18. The system of claim 16, wherein the controller is configured to predict whether the assembly of the connector is the proper assembly or the improper assembly by:

determining whether a connection mate signature is found within the extracted features by classifying the extracted features based on the training data using artificial intelligence.

19. The system of claim 15, wherein the controller is configured to verify the assembly of the connector in real-time while a battery for an electric vehicle that includes the connector is being assembled on the assembly line.

20. A method of verifying an assembly of a connector, the method comprising:

capturing at least one audio signal from within a footprint of an assembly line during the assembly of the connector;

tracking a relative position of an operator and an audio sensing device within the footprint, the audio sensing device configured to capture the at least one audio signal, tracking including:

detecting a position of the operator within the footprint;

determining whether the position of the operator is aligned with a position of the audio sensing device; and moving the audio sensing device towards the position of the operator, in response to determining that the position of the operator is misaligned with the position of the audio sensing device, wherein the determining whether the position of the operator is aligned with the position of the audio sensing device comprises:

calculating offsets for linear actuators associated with the audio sensing device based on the relative position of the operator and the audio sensing device;

verifying the assembly of the connector based on the at least one audio signal.

* * * * *